United States Patent
Mourey (10) Patent No.: US 7,990,056 B2
(45) Date of Patent: Aug. 2, 2011

(54) DISPLAY DEVICE COMPRISING COLOR FILTERS AND ELECTRONICALLY ALIGNED PHOTO-EMISSIVE ELEMENTS

(75) Inventor: Bruno Mourey, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 344 days.

(21) Appl. No.: 12/292,197

(22) Filed: Nov. 13, 2008

(65) Prior Publication Data

US 2009/0160329 A1    Jun. 25, 2009

(30) Foreign Application Priority Data

Dec. 21, 2007 (FR) ...................................... 07 09014

(51) Int. Cl.
*H01J 1/72* (2006.01)

(52) U.S. Cl. .................... 313/506; 313/500; 313/507

(58) Field of Classification Search .......... 313/498–512; 428/690–691; 257/40, 72, 98–100, 642–643, 257/759

See application file for complete search history.

(56) References Cited

U.S. PATENT DOCUMENTS

| 6,091,382 A | 7/2000 | Shioya et al. | |
| 2005/0040756 A1* | 2/2005 | Winters et al. | 313/504 |
| 2006/0214596 A1* | 9/2006 | Miller et al. | 315/169.3 |
| 2007/0103056 A1* | 5/2007 | Cok | 313/503 |
| 2007/0126358 A1* | 6/2007 | Okutani et al. | 313/512 |
| 2007/0242031 A1 | 10/2007 | Kimura et al. | |

FOREIGN PATENT DOCUMENTS

| EP | 0 845 770 A1 | 6/1998 |
| EP | 1 845 514 A2 | 10/2007 |
| JP | 2003121653 | * 4/2003 |

* cited by examiner

*Primary Examiner* — Toan Ton
*Assistant Examiner* — Fatima Farokhrooz
(74) *Attorney, Agent, or Firm* — Oliff & Berridge, PLC (57) ABSTRACT

A display device includes color filters and electronically aligned photo-emissive elements. The display device is achieved with a matrix of pixels. Each pixel includes a plurality of sub-pixels that are organized within the pixel in one or two directions. Each sub-pixel includes a color filter arranged facing a plurality of photo-emissive elements, an opaque area separating the color filters. In each of the organization directions of the pixel, the photo-emissive elements have a repetition pitch that is two times smaller than the pitch of the color filters. The size of each color filter is smaller than or equal to the size of the photo-emissive element in the organization direction. The display device includes a supply control circuit of the photo-emissive elements that selects the photo-emissive elements situated facing the color filter of each pixel.

20 Claims, 6 Drawing Sheets

DISPLAY DEVICE COMPRISING COLOR FILTERS AND ELECTRONICALLY ALIGNED PHOTO-EMISSIVE ELEMENTS

BACKGROUND OF THE INVENTION

The invention relates to a display device based on a matrix of pixels, each pixel comprising a plurality of sub-pixels organized within said pixel in at least one organization direction with a preset pitch, each sub-pixel comprising a color filter arranged, with the same pitch, facing at least one photo-emissive element, an opaque area separating the color filters, the device comprising a control circuit of the power supply of the photo-emissive elements.

STATE OF THE ART

Display devices conventionally comprise a matrix of independent color pixels each composed of a plurality of sub-pixels of primary colors. Each sub-pixel of primary color therefore represents an emissive element supplying light in a predefined color. This type of device is achieved for example by means of a matrix of colored organic light-emitting diodes each constituting a sub-pixel.

For display devices of small size and/or with high resolution, i.e. typically for pixels having a pitch of less than 50 μm, the organic light-emitting diode fabrication method does not enable sub-pixels of different color hues to be achieved.

Figure 1:
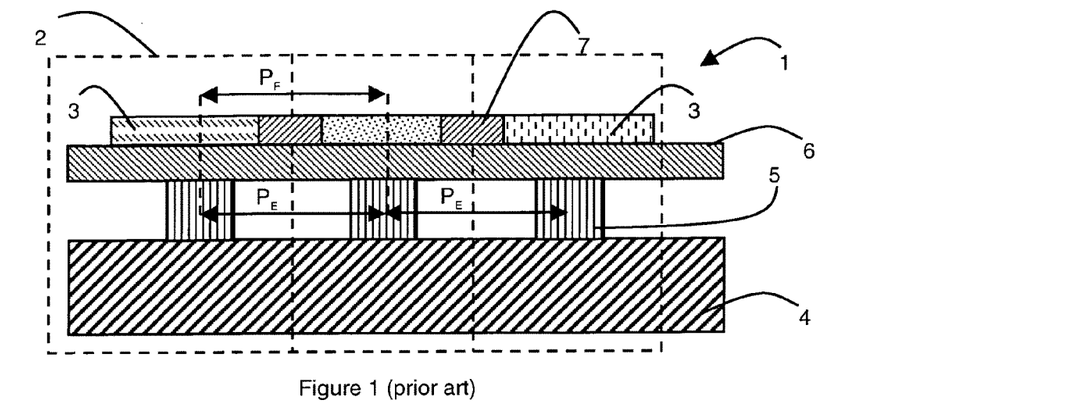
FIG. 1 represents a pixel of a device according to the prior art, schematically in cross-section.

For these display devices, formation of the color sub-pixels is then performed by associating light-emitting diodes emitting a white color with a matrix of color filters. As illustrated in FIG. 1, the display device comprises a matrix of pixels 1 organized in rows and columns in conventional manner. Each pixel 1 is formed by a plurality of color sub-pixels 2, for example blue, red, green and white sub-pixels. In conventional manner, the matrix of pixels 1 and therefore the matrix of sub-pixels 2 are achieved by disposing a matrix of color filters 3 above a substrate 4 supporting a plurality of photo-emissive elements 5. Each color filter 3 belongs to a sub-pixel 2 and the pitch of the sub-pixels is therefore identical to that ($P_F$) of the color filters.

Photo-emissive elements 5 are formed by any element able to emit light radiation and to be integrated with the required integration density. Photo-emissive elements 5 are for example organic light-emitting diodes formed, in conventional manner, on substrate 4, for example by a continuous stack of organic layers arranged between two electrodes: a cathode specific to each sub-pixel and an anode that is in general continuous. Photo-emissive elements 5 all emit the same color, preferably a white light, which enables a repetition pitch of less than 50 μm to be obtained between the diodes. The matrix of color filters 2 is produced by any suitable technique, for example by photolithography on a transparent substrate 6, and is then assembled for example by gluing onto the substrate 4.

Within a pixel 1, different organizations of sub-pixels 2 are possible, independently from the pixel organization. A sub-pixel 2 being associated with a color filter 3, the same color filter organization corresponds to each sub-pixel organization. Within a pixel 1, color filters 3 can be organized in one or two dimensions, i.e. in a line or a plane.

Figure 2:
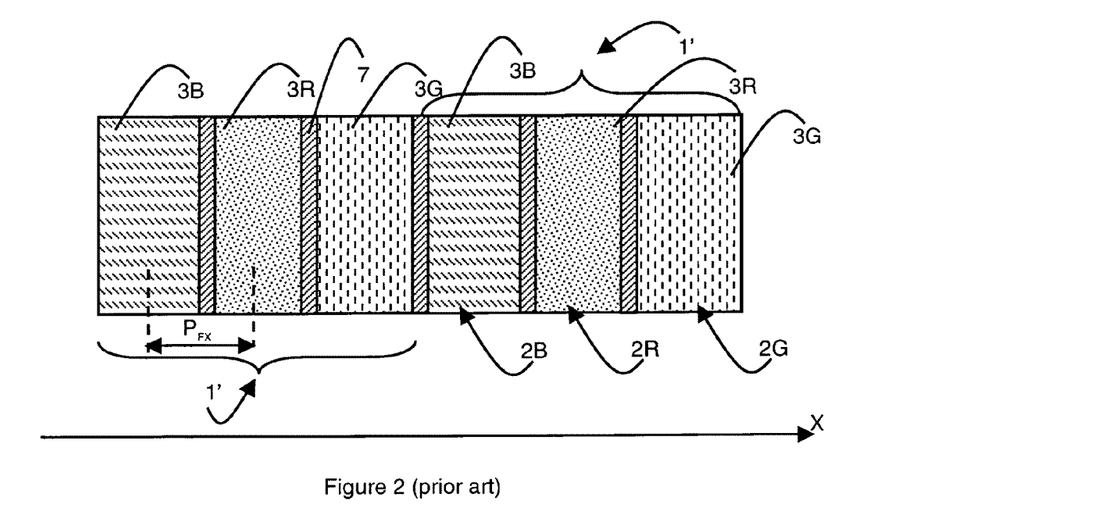
FIGS. 2 and 3 represent different organizations of color filters in a pixel of a device according to the prior art, in top view.

In pixels 1 and 1', an example of one-dimensional organization of color filters 3 arranged side by side in stripes is illustrated in FIG. 2. In this organization, three sub-pixels 2R, 2G, 2B and the corresponding color filters 3R, 3G, 3B form adjacent color stripes, arranged side by side with a pitch $P_{FX}$, in a single organization direction in a line (along the X-axis in FIG. 2) or in a column. Color filters 3R, 3B and 3G are advantageously rectangular with their smaller side parallel to the organization direction (X-axis in FIG. 2), defining the pitch ($P_{FX}$) of color filters 3.

Figure 3:
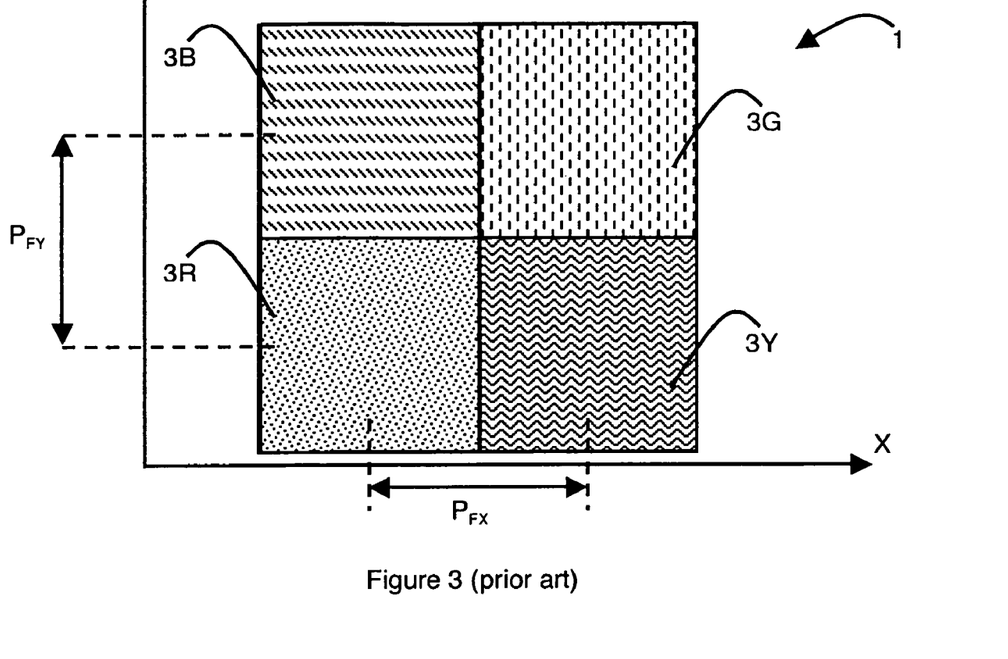

An example of two-dimensional organization of color filters 3 is represented by a quad (square) matrix organization in FIG. 3. In this organization, four color filters 3R, 3B, 3G, 3Y of each pixel are arranged in a quad (FIG. 3) with pitches $P_{FX}$ and $P_{FY}$ in a plane defined in two directions (perpendicular X and Y axes). Advantageously, the color filters are square.

The pitch $P_E$ of photo-emissive elements 5 is identical to pitch $P_F$ of color filters 3 in each of the organization directions ($P_{EX}=P_{FX}$ and $P_{EY}=P_{FY}$). Placing the matrix of color filters 3 above photo-emissive elements 5 is then performed using any conventional alignment technique.

The use of color filters presents the advantage of only having to form a single type of organic light-emitting diode on the substrate, which makes the fabrication method easier and enables a high integration density to be obtained.

However, this approach requires the matrix of color filters to be perfectly aligned with respect to the substrate supporting the organic light-emitting diodes. However, substrate alignment machines typically have alignment precisions of about one micron. To palliate any misalignment and to thereby prevent any mixing of information between the different sub-pixels, safety margins have to be provided between the sub-pixels. Opaque areas 7 are then arranged between the color filters. These opaque areas 7 are conventionally achieved by means of a reflecting element or advantageously by means of an absorbent filter with black colorants or by an absorbent metal layer, for example made from chromium, chromium oxide, or a chromium/$SiO_2$ cermet. The size of these opaque areas is of the same order of magnitude as the precision of the machines used, typically from one to two microns. Therefore, when the matrix pixel repetition pitch decreases, the proportion of the surface occupied by the opaque area increases and the signal decreases.

OBJECT OF THE INVENTION

The object of the invention is to provide a display device that is easy to implement, of small dimensions and/or high resolution, alleviating the constraints on the alignment methods.

The device according to the invention is characterized by the appended claims and particularly by the fact that each sub-pixel comprises at least two photo-emissive elements and that the photo-emissive elements have a repetition pitch that is two times smaller than the pitch of the color filters in each of the pixel organization directions, the size of each color filter being smaller than or equal to the size of the photo-emissive element in said direction, the control circuit comprising means for selecting the photo-emissive elements located facing each color filter of a pixel.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF A PREFERRED EMBODIMENT OF THE INVENTION

Within a pixel 1, depending on the respective sizes of color filters 3 and photo-emissive elements 5 and depending on the precision of the alignment means, misalignment can be in a single direction, for example along the X-axis, or in two directions i.e. along the X-axis and Y-axis.

A pixel 1 having a one-dimensional organization of its color filters 3, i.e. having color filters aligned side by side along an axis X (FIG. 2), is subject to misalignment in a single direction only, the direction (X-axis) along which its sub-pixels 2 are organized. Furthermore, a pixel 1 having a two-dimensional organization of its color filters 3 is, in conventional manner, subject to misalignment in two directions.

The matrices of color filters and photo-emissive elements have the same general organization, in a stripe, a triangle or a quad, that takes account of the pixel matrix and the organization of the sub-pixels within these pixels.

To alleviate the constraints relating to alignment between the matrix of color filters 3 and the matrix of photo-emissive elements 5, photo-emissive elements 5 present a repetition pitch ($P_E$) that is two times smaller than the repetition pitch ($P_F$) of color filters 5 in each of the organization directions of the color filters within the pixel ($P_{FX}=2P_{EX}$ and $P_{FY}=2P_{EY}$). There are therefore twice as many photo-emissive elements 5 as color filters 3 in each pixel organization direction.

Therefore, for a pixel having a one-dimensional organization in which the color filters 3R, 3B, 3G are arranged in the direction X only, there are therefore two photo-emissive elements 5 per sub-pixel 2. In like manner, for a two-dimensional organization of quad matrix type in which color filters 3 are arranged in a quad in two directions X and Y, there are therefore four photo-emissive elements 5 per sub-pixel 2.

Furthermore, in each of the organization directions of pixel 1, color filters 3 have a size that is smaller than or equal to the corresponding size of the photo-emissive elements. Therefore, as color filters 3 have a larger pitch $P_F$ than that $P_E$ of photo-emissive elements 5, color filters 3 are not joined. A non-colored area then exists, around adjacent color filters 3 of the same pixel 1 or of two adjacent pixels, which area separates them and through which a stray light emission could occur. To prevent his stray light emission, this area 7 situated around color filters 3 is made opaque by absorption or reflection of the emitted light radiation, by any suitable means, preferably by means of an absorbent film similar to the one used for producing devices of the prior art. Area 7 can be achieved by means of an absorbent filter with black colorants or by an absorbent metal layer, for example made from chromium, chromium oxide, or a chromium/$SiO_2$ cermet.

Color filters 3 having a pitch $P_F$ two times larger than that $P_E$ of photo-emissive elements 5, the size L of the absorbent area (in the organization direction considered) is greater than or equal to that of a color filter 3. In other words, size L of color filter 3 in each of the organization directions is always smaller than or equal to half the pitch $P_F$ Of sub-pixels 2 in this same direction.

Figure 4:
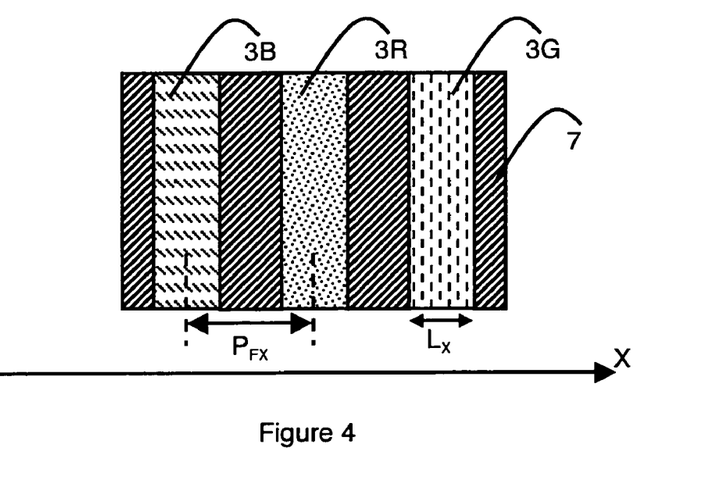
FIGS. 4 and 5 represent different organizations of color filters in a pixel of a device according to the invention, in top view.

In a one-dimensional organization illustrated in FIG. 4 in which color filters 3 of the pixel are arranged side by side along the X-axis, opaque area 7 is arranged on each side of each color filter 3 and the width $L_X$ of each color filter is such that: $2L_X \leq P_{FX}$.

Figure 5:
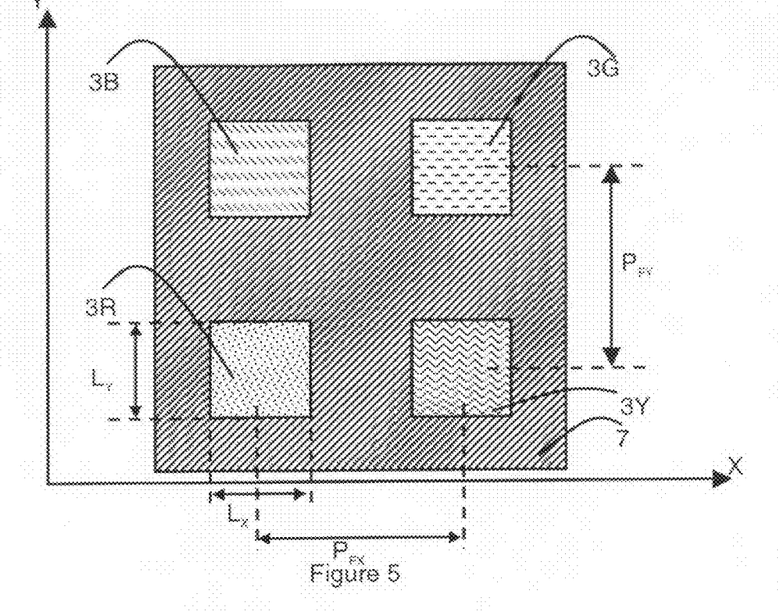

In a two-dimensional organization of quad matrix type illustrated in FIG. 5, color filters 3 are arranged in a quad in a plane X,Y. In both of the directions used (X, Y), the size L of color filter 3 is at least two times smaller than the pitch $P_F$ of sub-pixels 2 in the direction involved. Thus, $2L_X \leq P_{FX}$ and $2L_Y \leq P_{FY}$. Opaque area 7 then fills the whole surface of the pixel that surrounds color filters 3.

In all cases, the matrix of color filters comprises for example blue, green and red color filters (3B, 3G, 3R) separated by an opaque area 7 that can for example be achieved by photolithography before, during or after the color filters have been produced.

Color filters 3 and photo-emissive elements 5 having different repetition pitches ($P_F$, $P_E$), each sub-pixel 2 then comprises a plurality of photo-emissive elements 5 arranged facing a color filter 3. Simultaneous operation of the different photo-emissive elements 5 associated with a sub-pixel 2 then has to be constrained.

In a one-dimensional organization, each sub-pixel 2 comprises a color filter 3 associated with two photo-emissive elements 5. The end sub-pixels may comprise a single photo-emissive element 5 only. All the photo-emissive elements are identical and arranged side by side along the X-axis with a pitch $P_{EX}$.

Figure 6:
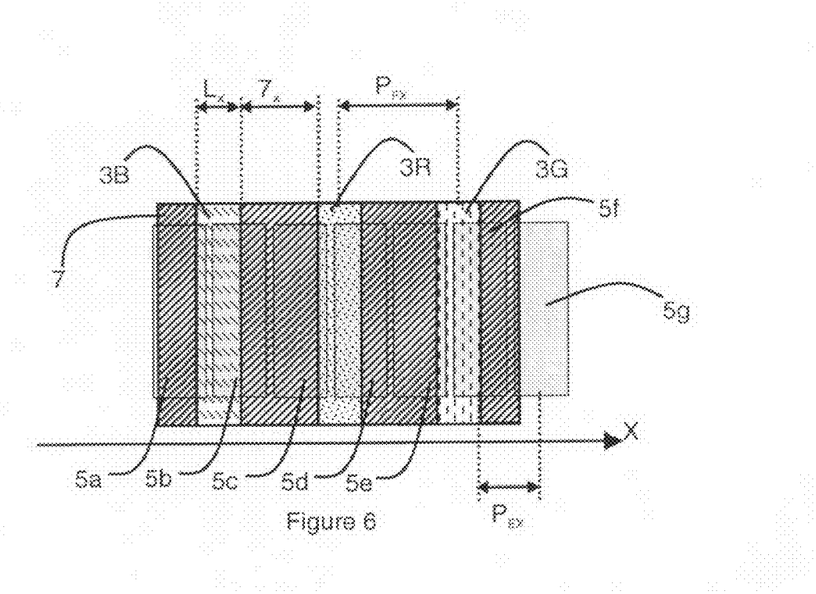
FIGS. 6 and 7 represent, in bottom view, two misalignments along an axis X between the color filters and photo-emissive elements of a pixel according to FIG. 4, FIGS. 8 and 9 represent two embodiments of a control circuit of a device according to the invention.
Figure 7:
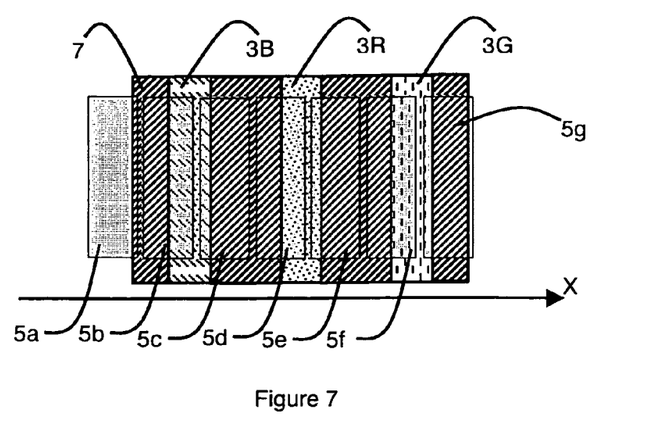

FIGS. 6 and 7 illustrate two different misalignments between the three color filters 3 of a pixel 1 and the seven adjacent photo-emissive elements 5a to 5g. Ideally the three color filters of the pixel should be aligned with the six photo-emissive elements 5a to 5f. A first misalignment, along X, is illustrated by FIG. 6. In this case, the two photo-emissive elements the farthest to the left, 5a and 5b, are partially covered by filter 3B. The next two photo-emissive elements 5c and 5d are partially covered by central filter 3R and the next two photo-emissive elements 5e and 5f are partially covered by filter 3G. Opaque area 7 of pixel 1 covers the rest of photo-emissive elements 5a to 5f As shown in FIG. 6, the size of the color filters along X is $L_X$, the size of each of the opaque areas is $7_X$, the pitch of the color filters is $P_{FX}$, and the pitch of the photo-emissive elements is $P_{EX}$.

In the misalignment illustrated in FIG. 6, photo-emissive elements 5a and 5b are thereby paired and associated with color filter 3B, photo-emissive elements 5c and 5d are paired and associated with color filter 3R and photo-emissive elements 5e and 5f are paired and associated with color filter 3G. Photo-emissive element 5g is not associated with the pixel considered, but with an adjacent pixel situated to the right of the latter. A small part of photo-emissive element 5g is covered by the opaque area of the pixel considered, whereas a part equivalent to that of photo-emissive element 5a is covered by the opaque area (not shown) of a pixel situated to the right of the pixel considered.

In the second misalignment, along the X-axis, illustrated by FIG. 7, photo-emissive elements 5b and 5c are partially covered by filter 3B, photo-emissive elements 5d and 5e by filter 3G and photo-emissive elements 5f and 5g by filter 3R. In the misalignment illustrated in FIG. 7, photo-emissive elements 5b and 5c are paired and associated with color filter 3B, photo-emissive elements 5d and 5e are paired and associated with color filter 3R and photo-emissive elements 5f and 5g are paired and associated with color filter 3G of the same pixel. Photo-emissive element 5a is no longer, in this case, associated with the pixel considered, but with an adjacent pixel situated to the left of the latter.

Thus, according to the misalignment that exists between substrate 4 comprising photo-emissive elements 5 and the matrix of color filters 3, the same color filter 3 of a pixel does not always cover the same photo-emissive elements 5. However, whatever the misalignment, in so far as no account is taken of the spacing comprised between two adjacent photo-emissive elements, each color filter is situated totally facing the equivalent of a photo-emissive element having the dimensions of the color filter considered. Color filters 3 and photo-emissive elements 5 therefore do not have to be perfectly aligned. The adjacent photo-emissive elements 5 effectively covered by each color filter and that are to be associated with each sub-pixel 2 do however have to be selected in subsequent use of the device. This selection can be assimilated to electronic alignment of each color filter 3 with the photo-emissive elements it covers. This is performed by means of a supply control circuit of the photo-emissive element comprising means for selecting the photo-emissive elements located facing each color filter of a pixel.

Figure 8:
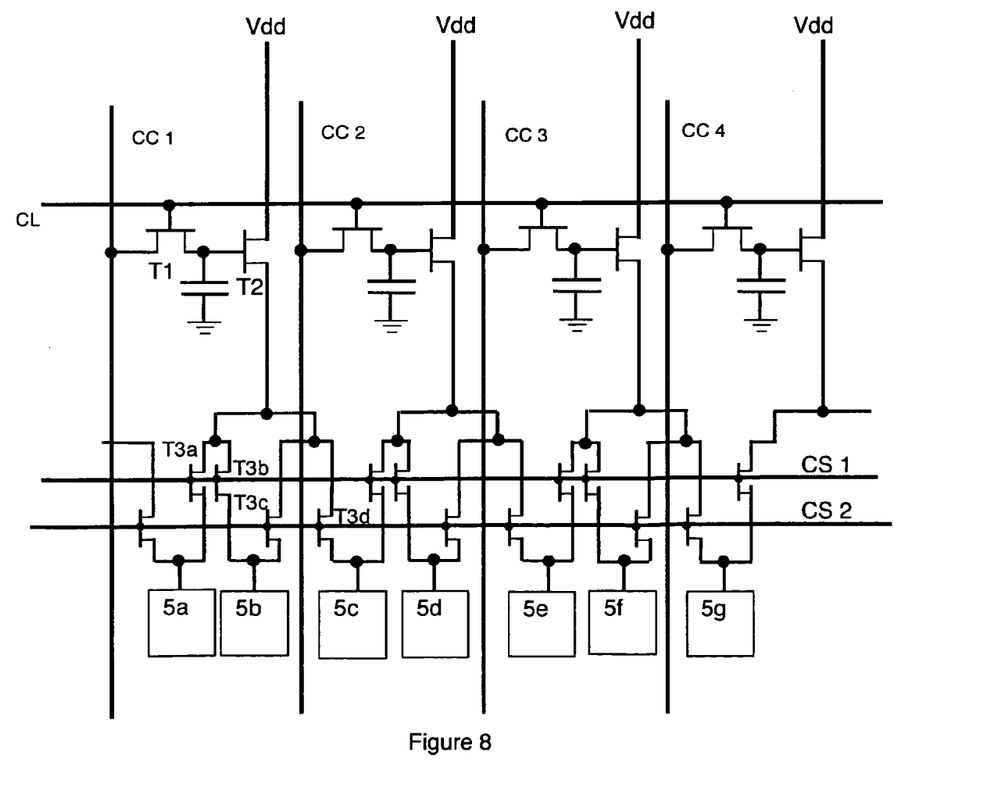

The supply control circuit of the photo-emissive elements, illustrated in FIG. 8, correspond to a row of pixels 1 each having three sub-pixels illustrated in FIGS. 6 and 7. The control circuit comprises a row command CL that corresponds to the row of pixels to be supplied and column commands CC (CC1 to CC4 in FIG. 8) that control supply of the different sub-pixels of this row.

A first electronic switch T1 associated with column command CC1 is connected between column command CC1 and the control electrode of a second electronic switch T2. The control electrode of a first electronic switch T1 is connected to row command CL.

Each column command CC is connected to first and second electronic switches as specified above, second electronic switches T2 all being connected to row command CL.

Each second electronic switch T2 is connected to a supply terminal Vdd and to four third electronic switches T3 (T3a to T3d). Each third electronic switch T3 is itself connected to a photo-emissive element such that each photo-emissive element 5 is connected to two third electronic switches T3. Thus, electronic switch T2 associated with column command CC1 is connected via electronic switch T3a to photo-emissive element 5a, via electronic switches T3b and T3c to photo-emissive element 5b and via electronic switch T3d to photo-emissive element 5c. Photo-emissive element 5c is also connected to electronic switch T2 associated with column command CC2.

Each sub-pixel 2 is therefore associated with a column command CC and each column command CC is connected to three immediately adjacent photo-emissive elements. Column command CC1 is thus connected to photo-emissive elements 5a/5b/5c, and column commands CC2 and CC3 are respectively connected to photo-emissive elements 5c/5d/5e and 5e/5f/5g by means of the electronic switches. Column command CC4 corresponds to the immediately adjacent pixel and is in particular connected to photo-emissive element 5g.

Photo-emissive elements 5 are associated two by two with a column command CC by means of two selection commands CS1 and CS2 being in opposite states. Selection commands CS are connected according to a predefined wiring diagram to the control electrodes of the third electronic switches T3 so as to associate only two adjacent photo-emissive elements 5 with a single column command CC. Selection command CS1 is connected to the control electrodes of electronic switches T3a and T3b, whereas selection command CS2 is connected to the control electrodes of electronic switches T3c and T3d. Advantageously, photo-emissive element 5b is connected directly to a second electronic switch T2, i.e. without third electronic switches T3b and T3c. The same is the case for photo-emissive elements 5d and 5f.

When selection command CS1 is in high state, electronic switches T3a and T3b connecting photo-emissive elements 5a and 5b to column command CC1 are turned on and electronic switches T3c and T3d are turned off. This causes simultaneous operation of photo-emissive elements 5a and 5b when a column command CC1 signal is applied. In the same way, operation of photo-emissive elements 5c and 5d then depends on the state of column command CC2 and operation of photo-emissive elements 5e and 5f on the state of column command CC3.

On the contrary, when selection command CS2 is in high state, electronic switches T3c and T3d connecting photo-emissive elements 5b and 5c to column command CC1 are on and electronic switches T3a and T3b are off. This causes simultaneous operation of photo-emissive elements 5b and 5c when a column command CC1 signal is applied. In the same way, operation of photo-emissive elements 5d and 5e then depends on the state of column command CC2 and operation of photo-emissive elements 5f and 5g on the state of column command CC3.

Depending on the value of selection signals CS1 and CS2, the photo-emissive elements of a sub-pixel associated with column command CC1 are therefore different, 5a and 5b if CS1 is in high state, 5b and 5c otherwise. Therefore, in a one-dimensional organization illustrated by FIGS. 6 to 8, each sub-pixel 2 is formed by a color filter associated with the two selected photo-emissive elements connected to column command CC associated with the sub-pixel.

To choose the selection command CS to be activated for selected photo-emissive elements 5 to be arranged facing the color filter of the corresponding sub-pixel, determination of the misalignment between the color filters and the photo-emissive elements is performed by successively switching each of the selection commands CS1 and CS2 to high state and monitoring the quality of the image obtained. Selection command CS corresponding to zero misalignment is then held in high state. In this way, alignment is performed electronically between photo-emissive elements 5 and color filters 3.

If distinct selection commands CS are associated with each line of pixels, as illustrated in FIG. 8, electronic alignment is performed independently for each line of the display device. Alignment in columns is also possible if the sub-pixels are organized in columns.

Figure 9:
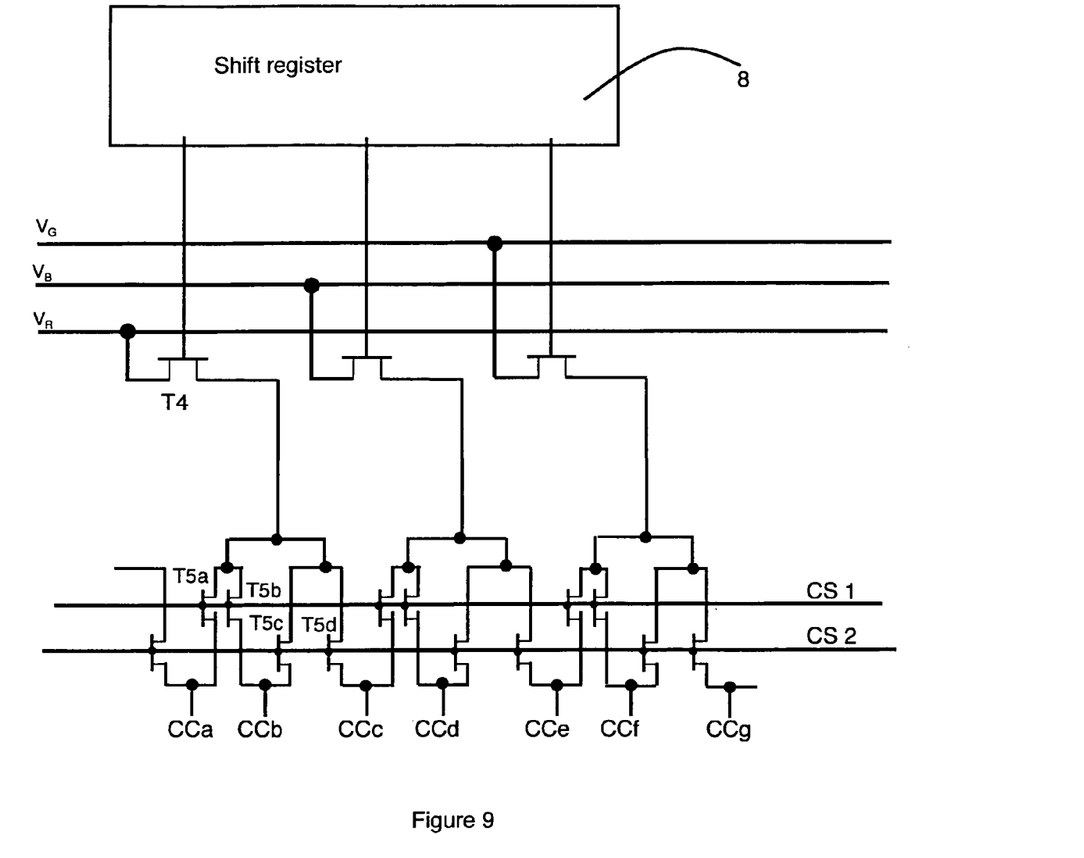

Two opposite selection commands CS1 and CS2 can also be used for the whole set of rows or columns of the display device or as a variant for a portion of the display device, i.e. the display device is divided for example into two, three or four groups of rows or columns and each group of rows or columns then comprises two selection commands. In the control circuit of FIG. 9, selection is performed between video signals $V_G$, $V_B$, $V_R$ corresponding to each color and column commands CC of the control circuit, each column command being associated with a column of photo-emissive elements (FIG. 9). Column commands CCa to CCg thus control operation of all the photo-emissive elements respectively 5a to 5g of the same column of the display device.

In the embodiment illustrated in FIG. 9, an electronic switch T4 is connected between a video signal (for example $V_R$) and four electronic switches T5a to T5d. Each electronic switch T5 is connected to a corresponding column command (CCa to CCc for electronic switches T5a to T5d) each controlling all the photo-emissive elements of the one and the same column. Selection command CS1 is connected to the control electrodes of electronic switches T5a and T5b, whereas selection command CS2 is connected to the control electrodes of electronic switches T5c and T5d. In this way, when selection command CS1 is activated, video signal $V_R$ is applied to the two column commands CCa and CCb via electronic switches T5a and T5b and controls all the photo-emissive elements 5a and 5b. When selection command CS2 is activated on the other hand, video signal $V_R$ is applied to the two column commands CCb and CCc via electronic switches T5c and T5d and controls all the photo-emissive elements 5b and 5c. In like manner, video signal $V_B$ is applied to column commands CCc and CCd if CS1 is activated and to column commands CCd and CCe if CS2 is activated. Video signal $V_G$ is applied either to column commands CCe and CCf or to column commands CCf and CCg. Thus, when signals from a shift register 8 are successively applied to the control electrodes of electronic switches T4 respectively associated with the various video signals, the selected photo-emissive elements are activated. Column commands CCb, CCd and CCf are advantageously connected directly to the corresponding video signal.

In general manner, the means for selecting the photo-emissive elements comprise as many selection commands as sub-pixel 2 comprises photo-emissive elements 5. Thus, in a two-dimensional quad matrix organization, each sub-pixel comprises four photo-emissive elements 5 with misalignment management in two directions. The means for selecting the photo-emissive elements then comprise four selection commands.

Figure 10:
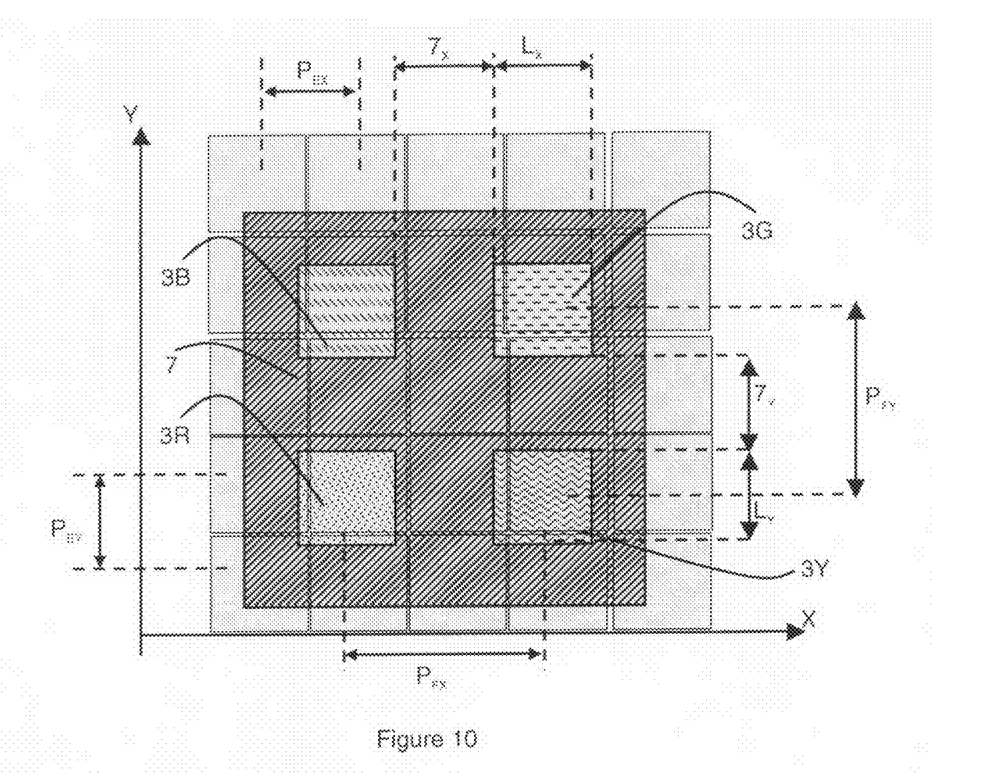
FIG. 10 represents the alignment respectively for a pixel according to FIG. 5, in bottom view.

For this two-dimensional quad matrix organization illustrated in FIG. 10, the means for selecting the photo-emissive elements are similar to those described in the case of a one-dimensional organization. However, two selection commands are then used to perform alignment along the X-axis and two other selection commands for alignment along the Y-axis.

A first alignment can be performed along the X-axis on all the rows of photo-emissive elements of the pixel and a second alignment along the Y-axis is then performed on the columns of photo-emissive elements or vice-versa.

In all cases, the selection commands enable photo-emissive elements 5 and corresponding color filters 3 to be aligned electronically, determining which are the photo-emissive elements that are effectively arranged facing the color filter considered.

The invention claimed is:

1. A display device comprising:
   a matrix of color filters organized in a first organization direction with a first pitch,
   a plurality of opaque areas, an opaque area separating two adjacent color filters in the first organization direction, wherein a dimension of the opaque area is greater than or equal to a dimension of a color filter in the first organization direction, and
   a matrix of photo-emissive elements organized in the first organization direction with a second pitch, that is two times smaller than the first pitch, one color filter overlapping two consecutive photo-emissive elements, the dimension of the color filter in the first organization direction being smaller than or equal to a dimension of a photo-emissive element in the first organization direction.

2. The device according to claim 1, comprising a control circuit of a power supply of a first sub-pixel wherein a supply line of the first sub-pixel is linked to the two consecutive photo-emissive elements overlapped by the color filter.

3. The device according to claim 1, wherein three consecutive photo-emissive elements are connected to a first supply line by means of a first set of transistors and of a second set of transistors, the first set of transistors connecting two consecutive photo-emissive elements so as to form a first set of paired photo-emissive elements, the second set of transistors connecting two consecutive photo-emissive elements so as to form a second set of paired photo-emissive elements, the first and second sets of paired photo-emissive elements being shifted by the second pitch in the first organization direction.

4. The device according to claim 2, wherein the first sub-pixel comprises twice as many photo-emissive elements as color filters.

5. The device according to claim 2, wherein, in the first sub-pixel, the color filter overlaps four photo-emissive elements.

6. The device according to claim 2, wherein the control circuit comprises a selection device for forming a first set or a second set of two consecutive photo-emissive elements electrically paired, the first and the second set of two consecutive photo-emissive elements being shifted by the second pitch in the first organization direction.

7. The device according to claim 6, wherein the photo-emissive elements of the first set of two consecutive photo-emissive elements are connected to a first supply line by means of first transistors having a command electrode connected to a first command line so as to form paired photo-emissive elements.

8. The device according to claim 6, wherein in a row or a column of a matrix of photo-emissive elements, the photo-emissive elements are electrically paired by means of first and second transistors so as to form a plurality of paired photo-emissive elements, each pair of photo-emissive elements is connected to a specific supply line via said first and second transistors, and the first and second transistors are in opposite states.

9. The device according to claim 7, wherein the photo-emissive elements of the second set of two consecutive photo-emissive elements are connected to the first supply line by means of second transistors having a command electrode connected to a second command line so as to form paired photo-emissive elements, and the first and second command lines are in opposite states.

10. A display device comprising:
    a matrix of color filters organized in a first organization direction with a first pitch,
    a plurality of opaque areas, an opaque area separating two adjacent color filters in the first organization direction, wherein a dimension of the opaque area is greater than or equal to a dimension of a color filter in the first organization direction, and
    a matrix of photo-emissive elements organized in the first organization direction with a second pitch, that is two times smaller than the first pitch, one opaque area overlapping two consecutive photo-emissive elements, the dimension of the color filter in the first organization direction being smaller than or equal to a dimension of a photo-emissive element in the first organization direction.

11. The device according to claim 10, wherein a first pattern is formed by one color filter and one adjacent opaque area in the first organization direction, the first pattern overlapping three consecutive photo-emissive elements.

12. The device according to claim 10, comprising a control circuit of a power supply of a first sub-pixel, wherein a supply line of the first sub-pixel is linked to the two consecutive photo-emissive elements overlapped by the opaque area.

13. The device according to claim 10, wherein three consecutive photo-emissive elements are connected to a first supply line by means of a first set of transistors and of a second set of transistors, the first set of transistors connecting two consecutive photo-emissive elements so as to form a first set of paired photo-emissive elements, the second set of transistors connecting two consecutive photo-emissive elements so as to form a second set of paired photo-emissive elements, the first and second sets of paired photo-emissive elements being shifted by the second pitch in the first organization direction.

14. The device according to claim 12, wherein the first sub-pixel comprises twice as many photo-emissive elements as color filters.

15. The device according to claim 12, wherein, in the first sub-pixel, the color filter overlaps four photo-emissive elements.

16. The device according to claim 12, wherein the control circuit comprises a selection device for forming a first set or a second set of two consecutive photo-emissive elements electrically paired, the first and the second set of two consecutive photo-emissive elements being shifted by the second pitch in the first organization direction.

17. The device according to claim 16, wherein the photo-emissive elements of the first set of two consecutive photo-emissive elements are connected to a first supply line by means of first transistors having a command electrode connected to a first command line so as to form paired photo-emissive elements.

18. The device according to claim 16, wherein in a row or a column of a matrix of photo-emissive elements, the photo-emissive elements are electrically paired by means of first and second transistors so as to form a plurality of paired photo-emissive elements, each pair of photo-emissive elements is connected to a specific supply line via said first and second transistors, and the first and second transistors are in opposite states.

19. The device according to claim 17, wherein the photo-emissive elements of the second set of two consecutive photo-emissive elements are connected to the first supply line by means of second transistors having a command electrode connected to a second command line so as to form paired photo-emissive elements, and the first and second command lines are in opposite states.

20. A method for producing a display device, successively comprising:
   providing a matrix of photo-emissive elements organized in a first organization direction with a first pitch,
   providing a matrix of color filters organized in the first organization direction with a second pitch that is two times larger than the first pitch, two adjacent color filters being separated by an opaque area in the first organization direction, wherein a dimension of the opaque area is greater than or equal to a dimension of a color filter in the first organization direction,
   associating the matrix of color filters with the matrix of photo-emissive elements so as to form a sub-pixel comprising a color filter overlapping two consecutive photo-emissive elements in the first organization direction, and
   supplying power successively to a first set of two successive photo-emissive elements and to a second set of two successive photo-emissive elements so as to monitor if the first set or the second set of photo-emissive elements is overlapped by the color filter, the first set and the second set being shifted in the first organization direction by one photo-emissive elements.

* * * * *